United States Patent [19]

Carson et al.

[11] 4,126,882
[45] Nov. 21, 1978

[54] PACKAGE FOR MULTIELEMENT ELECTRO-OPTICAL DEVICES

[75] Inventors: Kent R. Carson, McKinney; Charles M. Hess, Dallas, both of Tex.

[73] Assignee: Texas Instruments Incorporated, Dallas, Tex.

[21] Appl. No.: 710,771

[22] Filed: Aug. 2, 1976

[51] Int. Cl.² .................... H01L 23/02; H01L 23/12; H01L 23/16
[52] U.S. Cl. .................................. 357/74; 357/75; 357/80; 361/400; 361/401
[58] Field of Search .................. 357/75, 17, 74, 80, 357/81; 361/400, 401

[56] References Cited

U.S. PATENT DOCUMENTS

| | | | |
|---|---|---|---|
| 3,713,006 | 1/1973 | Litty et al. | 357/75 |
| 3,753,054 | 8/1973 | Johnson | 357/75 |
| 3,908,184 | 9/1975 | Anazawa et al. | 357/75 |
| 4,011,575 | 3/1977 | Groves | 357/17 |
| 4,044,374 | 8/1977 | Roberts et al. | 357/74 |
| 4,055,725 | 10/1977 | Boynton | 357/75 |

Primary Examiner—Andrew J. James
Attorney, Agent, or Firm—Rene' E. Grossman; Alva H. Bandy

[57] ABSTRACT

Disclosed is a semiconductor device package for a multielement electro-optical device. The package includes a base structure, a cover and an environmental seal. The cover is secured with screws to the base structure and sealed at this interface to provide an environmentally protected package. The base structure includes a base member and a fine geometry lead pattern substrate loosely attached to the base member internal to the package. Connector pins are mounted either in retainer blocks or in the substrate attached to the base. The multielement electro-optical device is mounted upon a support member and its elements electrically coupled to leads to provide for testing prior to incorporation into the package. The device and support member or members constitute a subassembly which is electrically coupled to the lead pattern of the package substrate. The package substrate may be a single substrate loosely mounted on the base member to provide a substantially stress-free package or a segmented substrate of which each segment is loosely attached to the base plate to provide even a more substantially stress-free package.

5 Claims, 8 Drawing Figures

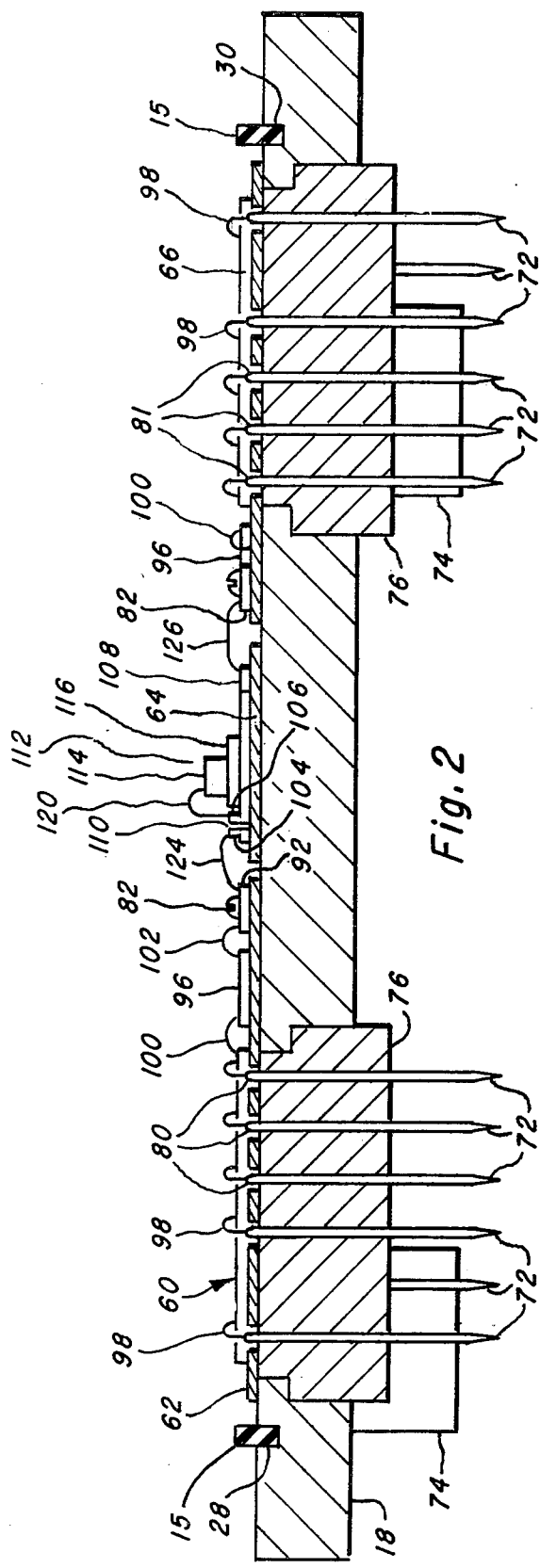
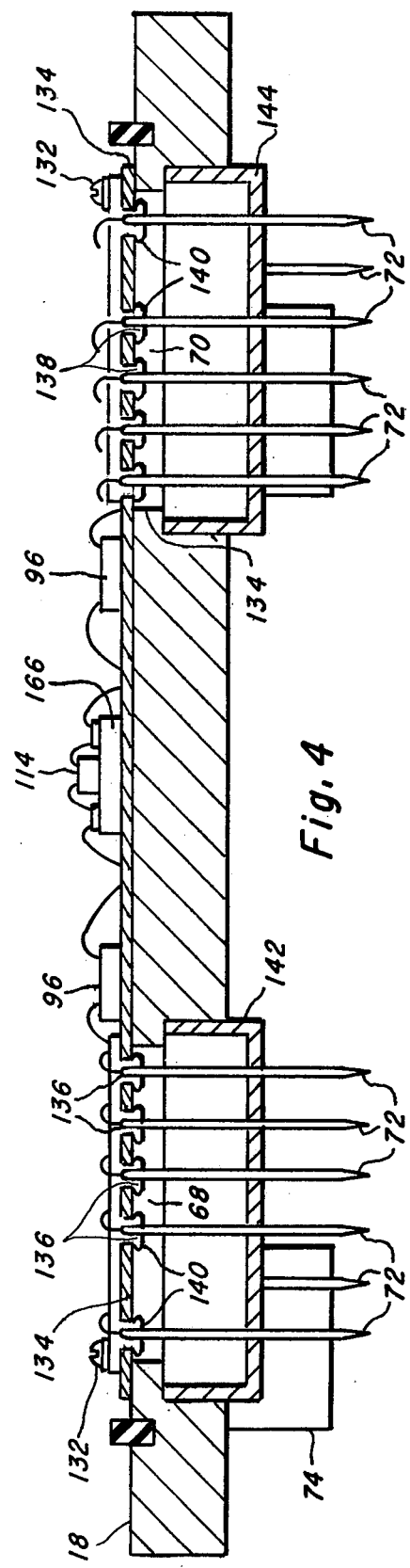
Fig. 2
Fig. 4

Fig.3

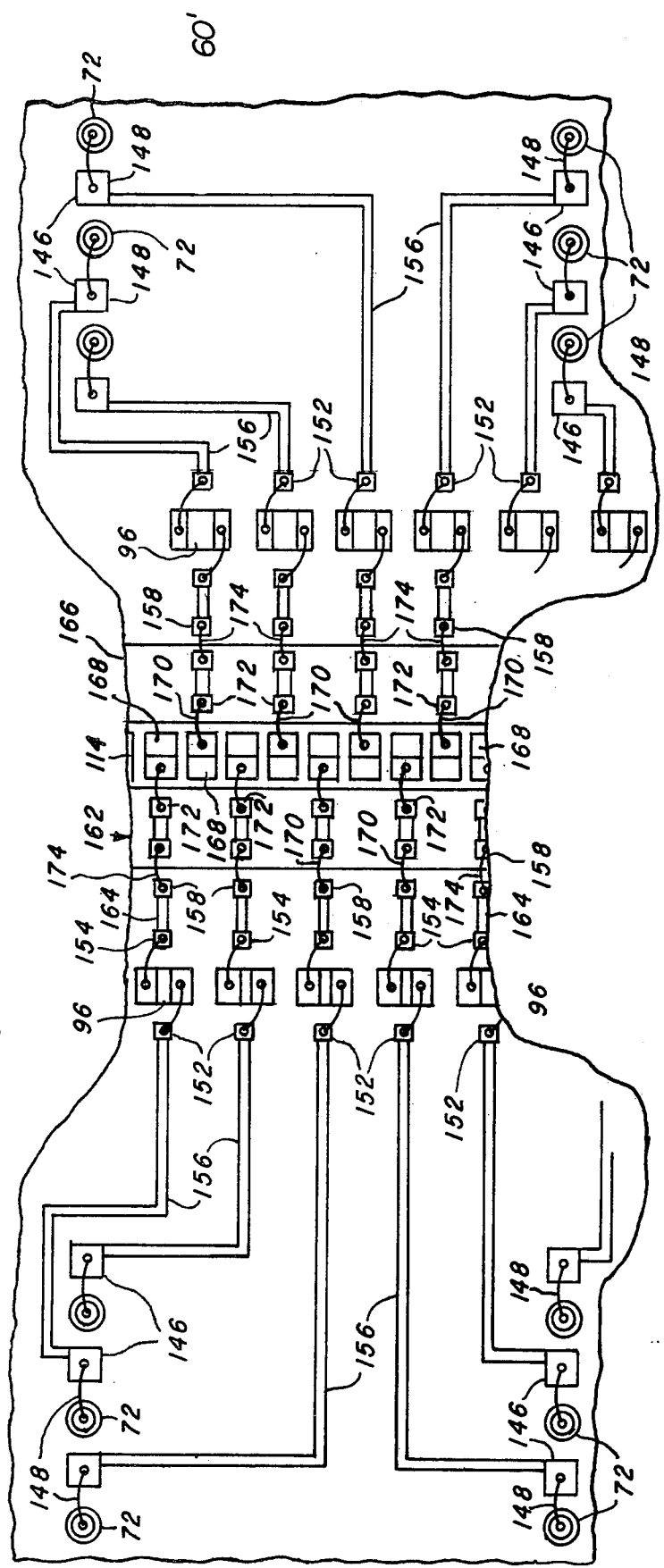

PACKAGE FOR MULTIELEMENT ELECTRO-OPTICAL DEVICES

This invention relates to semiconductor device packages and more particularly to a package for a multielement, electro-optical device such as, for example, a linear, light-emitting diode array.

In the past, packages for multielement, electro-optical devices, such as, for example, light-emitting diode arrays having included the array mounted on a gold plated heatsink by soldering. Thus the cathodes of all the diodes were electrically common to the heatsink. The light-emitting diode array-heat sink assembly was mounted in a well of a rigid, thermally massive, machined metal base using electrically insulated mounts to insulate the subassembly from the base. Layers of "H-film;" i.e., two thin layers of a polyimide film sold under the trademark KAPTON sandwiching a copper electrical lead pattern, were adhesively bonded to each side of the heatsink adjacent to the light-emitting diode array. One end of each "H-film" lead was wire bonded to a metal pad on the light-emitting diode array chip or to the common cathode heatsink and the other end of each lead was soldered to the head of a connector pin. The connector pins were mounted in the metal base. Plastic inserts were used to insulate them from the metal base. Portions of the connector pins protruded from beneath the base to form male connectors. A cover, having a foil aperture and an optical lens mounted in the cover over the light-emitting diode array, was secured to the base to complete the package.

The prior art package described above had many disavantages. For an example, because of the numerous close tolerance machined and etched piece parts, the package was difficult and costly to manufacture. For another example, the light-emitting diode array could not be tested before installation in the package. As installation was permanent, array failures reduced the yield of acceptable packaged devices. For yet another example, the inconsistent quality of solder and wire bonds to "H-film" leads produced opens in the "H-film" lead connections. Further, coupling forces during connection with external female connectors caused connector pins to push through the plastic insert mountings resulting in damage to the "H-film". These failures reduced substantially the reliability of the package. To increase reliability, the mass of certain package elements was increased. Nevertheless, the additional weight and size of the package became objectionable for use in many system applications.

Accordingly, it is an object of this invention to provide a small, light weight, highly reliable, low cost package for a multielement, electro-optical device which is economical to manufacture.

Another object of the invention is to provide a package in which miniaturized electrical circuit elements can be mounted together with the multielement, electro-optical device.

Still another object of the invention is to provide a structural arrangement for a package which alleviates the rupture of the connector pin-electrical circuit pattern joints during either connection or removal of an external connector to the package connector pins, or thermal expansion between the electrical lead substrate member, or members, and the base member.

Yet another object of the invention is to provide a packaged multielement light-emitting diode array having high diode brightness uniformity.

Still yet another object of the invention is to provide a package in which the multielement electro-optical device can be incorporated in a package subassembly and pretested before incorporation into the package.

Briefly stated the invention comprises a covered, sealed, base structure. In one embodiment, the base structure includes a base member supporting one or more connector pin blocks and a segmented substrate. The multielement electro-optical device subassembly, which includes the device, is mounted upon a segment of the substrate. Portions of an electrical connector lead pattern are formed on the substrate segments, including the segment on which the device is mounted and electrically connected to form a lead pattern. Each lead of the electrical lead pattern is connected between an element of the multielement electro-optical device and an end of one of the plurality of connector pins. To provide for coupling force distribution to the base member, the connecting pins are mounted in insulator blocks mounted in shouldered apertures of the base member. This feature provides for even distribution of the insertion forces to the connector pin blocks and base member, thereby minimizing the thickness of the substrate and application of stress to the substrate during connector insertion and withdrawal. In another embodiment, the base member supports a single substrate. The substrate has holes for connecting pins, and screws for attaching the substrate to the base member and a site bearing a multielement electro-optical device subassembly. The substrate, with connecting pins mounted in the holes therein, is attached by screws to the base member. In either embodiment, the cover includes a lens covered optical aperture for passing light from the multielement electro-optical device.

Novel features characteristics of the embodiment of the invention can best be understood by reference to the following detailed description when read in conjunction with their accompanying drawings, wherein:

FIG. 1a–d is an exploded isometric view of the multielement electro-optical package;

FIG. 2 is a cross-sectional view of a first embodiment of the base structure of the package;

Figure 3:
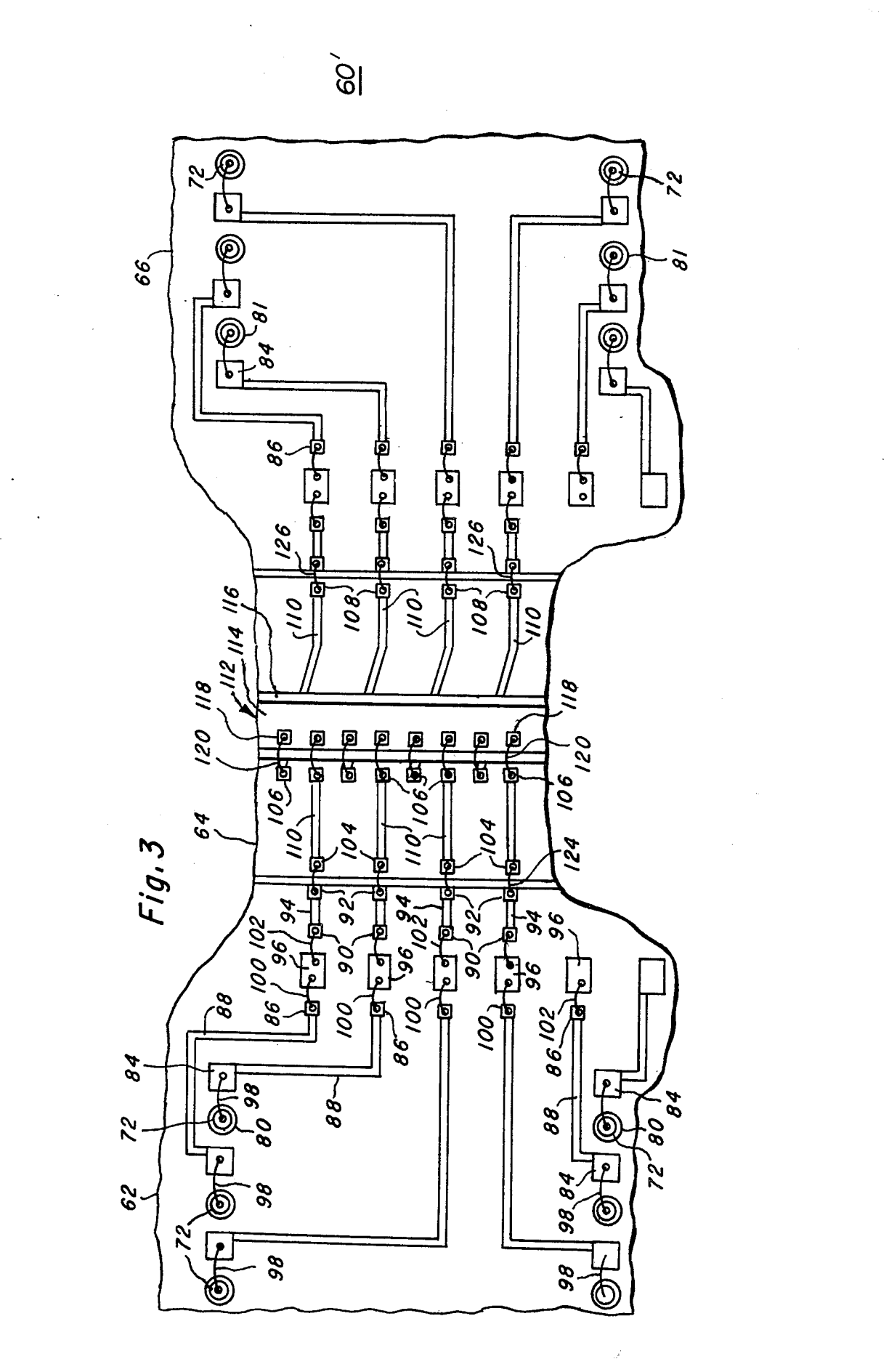

FIG. 3 is a partial plan view showing the first embodiment arrangement for interconnecting the elements of the device to the metalized substrate;

FIG. 4 is a cross-sectional view of a second embodiment of the base structure of the package; and FIG. 5 is a partial plan view showing the second embodiment arrangement for interconnecting the elements of the device with the metalized substrate.

Figures 1A, 1B, 1C, 1D:
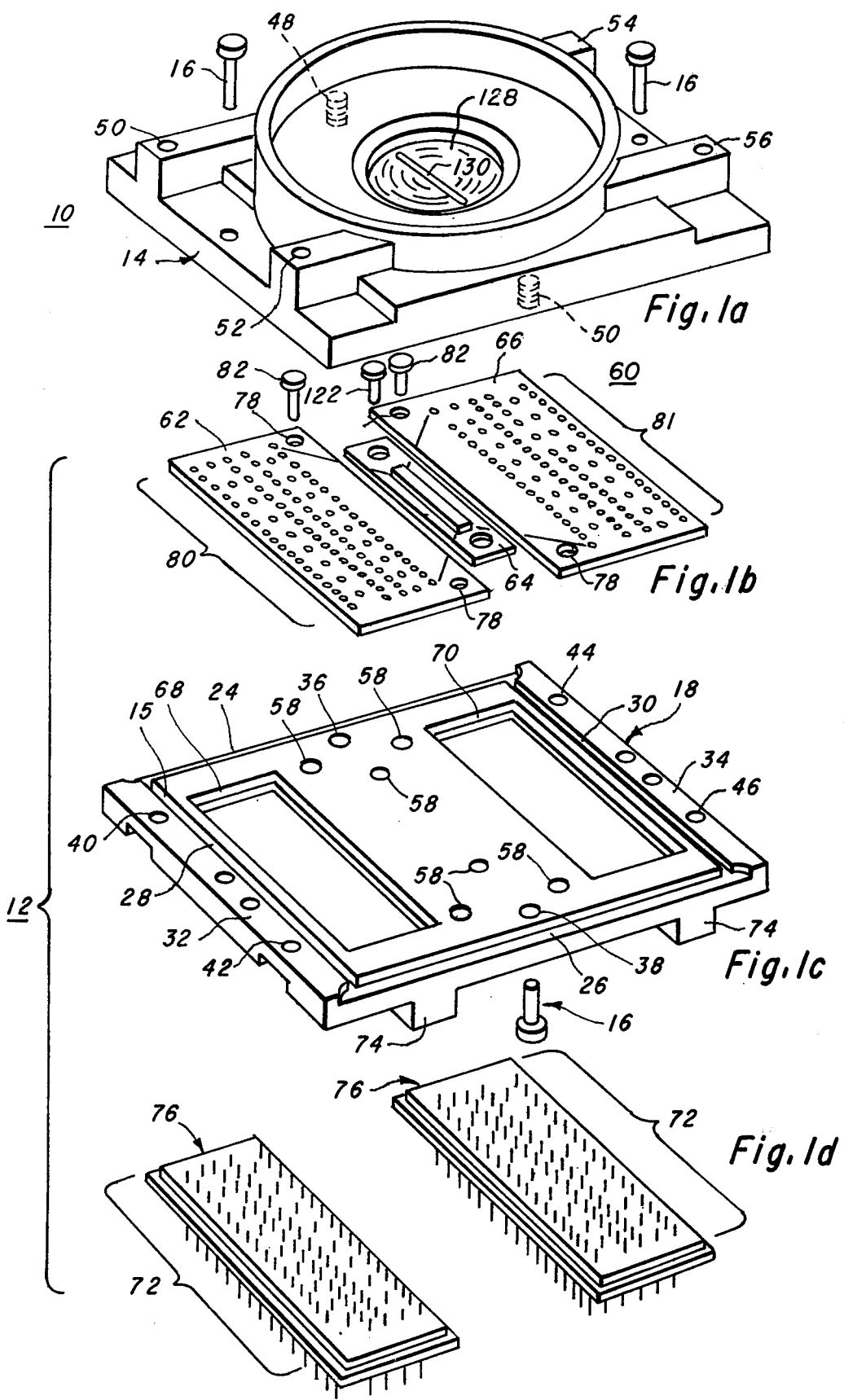

Referring to the drawings, the multielement electro-optical device construction is described utilizing a linear light-emitting diode array chip. It will be appreciated by those skilled in the art that other multielement devices can be used and that a light-emitting diode array is used as an example only.

Referring to FIGS. 1a–d and 2 and 3 for a preferred embodiment of the invention, the package 10 construction comprises a base structure 12, a cover 14, an environmental seal 15, is desired, and screws 16. The screws 16 secure the cover 14 to the base structure 12.

The base structure 12 (FIGS. 1b–d) comprises a base member plate 18 which may be, for example, of machined aluminum or alloy to provide a heatsink for the multielement electro-optical device. The plate 18 (FIG.

1c) is preferably rectangular in shape with opposing sides 24-26 recessed and in communication with U-shaped grooves 28-30 adjacent to opposing sides 32-34. Recessed sides 24-26 and U-shaped grooves 28-30 provide a retainer for environmental seal 15. The seal 15 may be a rubber or plastic seal. Assembly holes 36 and 38 are provided adjacent to recessed sides 24-26 intermediate to sides 32-34. Threaded holes 40 and 42 are spaced apart between side 32 and U-shaped groove 28, and threaded holes 44-46 are spaced apart between side 34 and U-shaped groove 30. Holes 36-38 correspond to threaded holes 48-50 of cover 14 (FIG. 1a) and are utilized to attach the cover 14 to the base structure 12 by screws 16. Threaded holes 40-42 and 44-46 (FIG. 1c) correspond to apertures or holes 50, 52, 54, 56 of cover 14 (FIG. 1a); these holes are utilized to attach the package to external structures of a complete system.

Plate 18 of base structure 12 (FIGS. 1c and 2) also includes threaded holes 58 for attaching a segmented substrate 60 (FIG. 1b) consisting of segments 62, 64, and 66, and connector block holes 68 and 70 (FIG. 1c). The connector pin block holes 68 and 70 may be, for example, rectangular in shape and shouldered to receive flanges of the connector pin blocks 76 (FIG. 1d). Connector pins 72 are mounted by molding or bonding them into one or more of the retainer blocks 76 (FIGS. 1d and 2). Portions of the pins extend above and below the retain blocks 76. The portion of the connector pins extending beneath the retainer blocks 76 form male members beneath plate 18 which mate with female external connector plugs (not shown). Legs 74 depend from plate 18 and provide support for the external connector plugs. Retainer blocks 76 (FIG. 1d) are fabricated for example, of a high strength, electrically insulating material, such as a glass filled diallyl phthalate. The retainer blocks 76 are adhesively bonded or otherwise securely mounted in shouldered holes 68 and 70 of plate 18 (FIGS. 1c and 2). By using the connector pin retainer blocks 76 and mounting them in plate 18 with, for example, an epoxy glue, the force created by the insertion and removal of the external connector plug will be transmitted uniformly throughout the block 76 and plate 18 thereby alleviating any coupling force on the segmented substrate.

Substrate segments 62, 64 and 66 (FIG. 1b) of substrate 60 are fabricated, for example, of alumina, beryllia, or any other suitable insulating ceramic or other dielectric type material, and metallized with, for example, titanium-gold/plated gold; titanium-tungsten-gold/plated gold; chromium-gold/plated gold; or a gold-bearing paste of any other metal layer or combination of layers that has low electrical sheet resistivity, is bondable, adheres well to the substrate and patternable to form fine geometry electrical leads. Segments 62 and 66 are provided each with columns of connector pin holes 80 and 81 and attachment holes 78. When the segments 62 and 66 are properly positioned on plate 18, the columns of connector pin holes 80 and 81 mate with the upper extending portions of the connector pins 72 and the attachment holes 78 match up with threaded holes 58 of the plate 18. Screws 82 (FIG. 2) are inserted through holes 78 and screwed into the threaded wells 58 to secure the substrate segments 62 and 66 to the plate 18. Thus mounted, the substrate segments are substantially free of high stress levels induced in the plate 18 during temperature cycling.

Substrate segment 62 and 66 (FIG. 3) are metallized and patterned, each to form a fine geometry lead pattern including: terminal pads 84 and 86 interconnected by leads 88 terminal pads 90 and 92 interconnected by leads 94. Terminal pads 86 and 90 are spaced one from the other to provide sides for discrete devices such as, for example, bias resistors 96. Bias resistors 96 may be discrete resistors, or discrete semiconductor chips bonded to the substrate segments 62 and 66, or thin film resistors deposited directly on the segments and subsequently trimmed to a desired value by, for example, a laser. Leads 98 interconnect terminal pads 84 to connector pins 72; while leads 100 and 102 interconnect, respectively, the bias resistors 96 to terminal pads 86 and 90. Leads 98, 100 and 102 may be, for example, wire leads formed by ball-bonding techniques or beam leads formed by beam lead techniques. Wire leads are particularly preferred for leads 98 as they provide flexibility between the connector pins 72 and terminal pads 84 to accommodate any vibrational movement of pins 72 produced by such forces as, for example, coupling or withdrawal of the external connector plugs. Substrate segment 64 (FIG. 3) is metallized and patterned to form a plurality of terminal pads 104, 106 and 108. Terminal pads 104 and 108 are positioned adjacent edges of the substrate 64 and are connected by leads 110 to corresponding terminal pads 106. Terminal pads 106 are positioned in a columnar manner between terminal pads 104 and 108 and adjacent a site for the multielement electro-optical device, which may be, for example, a light-emitting diode array chip subassembly 112. Terminal pads 104 are connected to every other one of terminal pads 106, and terminal pads 108 are coupled to the terminal pads 106 intermediate those coupled to terminal pads 104.

In order to permit all bonds between the multielement linear light-emitting diode array chip 114 to be made from only one side of the array chip, the chip 114 (FIGS. 2 and 3) is mounted on an electrically insulated substrate 116 such as, for example, a ceramic substrate. The array chip 114-substrate 116 is attached to substrate segment 64 to form subassembly 112. One surface of substrate 116 is metallized with, for example, gold and the array chip 114 is bonded to this surface with, for example, solder or a conductive epoxy adhesive to provide a common cathode contact to the chip 114. The substrate 116-chip 114 is mounted to substrate segment 64 using an electrically non-conductive adhesive. As the underside of substrate 116 and the adhesive are non-conductive, the leads 110 which pass beneath the substrate 116 are not electrically shorted together. The elements 118 of the multielement, light-emitting diode array 114 are then coupled to terminal pads 106 by, for example, wire leads 120 or beams formed, respectively, by ball bonding or beam-lead techniques. The chip 114-substrate 116-substrate segment 64 subassembly can be tested using, for example, a probe technique, and then attached by fastening substrate segment 64 to plate 18 by screws 122 (FIG. 1b). Terminal pads 92 and 104 (FIG. 3), respectively of substrate segments 62 and 64, and terminal pads 108 and 92, respectively, of substrate segments 64 and 66 are then electrically connected by, for example, wire or beam leads 124 and 126, respectively, using ball bonding or beam lead techniques. The segmented substrates 62, 64 and 66 thus electrically patterned and connected are substantially free of high level stresses and provide a highly reliable package.

The cover 14 (FIG. 1a) which may be fabricated using aluminum or a glass filled phenolic, thermosetting plastic, includes an optical assembly which comprises a lens 128 mounted over an aperture 130 formed in the cover in a shape corresponding to the light-emitting diode array chip. The optical assembly permits light from the light-emitting diodes to pass through the cover.

In another embodiment (FIGS. 4 and 5) in which the numerals of the first embodiment are used for like parts, a single substrate 60' replaces the segmented substrate 60 (FIG. 1b) of the preferred embodiment. The substrate 60' is loosely attached to base plate 18 by screws 132 passing through substrate holes 134 into threaded holes 58 in base plate 18. Substrate 60' is provided with a plurality of connector pin mounting holes 136 and 138 arranged, for example, in columns adjacent each end of the substrate 60' and over rectangular holes 68 and 70 in base plate 18. Connector pins 72 are mounted in holes 136 and 138 of the substrate 60' by, for example, brazing, soldering, bonding with conductive adhesive or glass frits 140. To provide additional mechanical support for the pins, rectangularly shaped, electrically non-conductive pin shells 142 and 144 are used. These shells, fabricated, for example, of a thermosetting epoxy plastic, are inserted in holes 68 and 70 of plate 18.

The substrate 60' is metallized (FIG. 5) with, for example, the same materials utilized to metallize substrate 60. The metallization is patterned to form: terminal pads 146 adjacent each end of the single substrate 60' to which the connector pins 72 are electrically connected by, for example, brazing, soldering, or ball bonding wire leads 148 thereto; a plurality of sites for electrical circuit elements such as, for example, the bias resistors 96 (FIG. 4) previously described; terminal pads 152 and 154 (FIG. 5) adjacent the sides of bias resistors 96, leads 156 which interconnect the connector pin terminal pads 146 to terminal pads 152, terminal pads 158 positioned adjacent a site for the multielement electro-optical device subassembly 162 (FIG. 4), and leads 164 (FIG. 5) interconnecting terminal pads 154 and 158.

In order to permit pretesting, the multielement light-emitting diode array chip 114 is mounted upon a substrate 166 (FIG. 4). Substrate 166 is metallized (FIG. 5) and patterned to form a fine geometry lead pattern. Each element 168 of the multielement light-emitting diode array chip 114 is coupled by, for example, a wire lead 170 which may be attached by the ball bonding technique to a terminal pad 172 of the lead pattern of substrate 166. This array chip 114-substrate 166 subassembly 162 is then tested, using, for example, a probe technique, prior to mounting on the package chip site. The subassembly 162 is mounted using, for example, a solder or a suitable adhesive bonding technique. The lead pattern of the substrate 166 is then electrically connected by wire leads 174 to the terminal pads 158 of the single substrate 60'. The base structure fabricated as described above is then covered with the cover 14 previously described to complete the package of this embodiment.

Although several embodiments of the invention have been described, it will be apparent to a person skilled in the art that various modifications to the details of construction shown and described, such as, for example, providing sites for the electrical components on the center substrate segment rather than on the outer segments or both, may be made without departing from the scope of this invention.

What is claimed is:

1. A package for a multielement electro-optical device comprising:

(a) a base means for supporting a multielement optical device including:
  (i) a base plate having walls forming a plurality of apertures;
  (ii) a plurality of electrical connecting pins;
  (iii) holding means mounted in the base plate apertures for supporting the connector pins;
  (iv) an electrically insulating substrate having walls forming a plurality of apertures, said plurality of apertures providing passages for the plurality of connecting pins through the substrate;
  (v) electrical patterns formed on said electrically insulating substrate, said patterns defining a site for the multielement electro-optical device to be mounted on the substrate and including terminal pads for electrically connecting the device to the electrical patterns;
  (vi) mechanical fasteners loosely securing the electrically insulating substrate to the base plate to reduce substantially stresses therebetween; and (b) a cover means for attachment to the base means, said cover means including an aperture means in optical alignment with the site for the multielement electro-optical device.

2. A package according to claim 1 wherein the holding means for the plurality of connector pins includes a plurality of shells having walls attached to the base plate apertures and bottoms having walls forming apertures for center portions of the plurality of connecting pins, said plurality of connector pins having upper and lower portions extending, respectively, above the apertured shell bottoms through a corresponding aperture of the electrically insulating substrate, and below the apertured bottoms to provide connector portions for connector plugs, said connecting pins rigidly connected to the walls forming the apertures of the apertured shell bottoms and electrically insulating substrate.

3. A package according to claim 1 wherein the holding means for the connecting pins includes a plurality of connector pin retainer blocks, each block having walls forming apertures for retaining center portions of each connector pin of portions of the plurality of connector pins, said connector pins having other portions extending above and below the block for connection to the electrical patterns of the substrate and for coupling to a connector plug, respectively, said plurality of blocks being rigidly mounted in the base plate apertures for uniformly distributing the connector plug force to the plurality of connector pin retainer blocks whereby the mass of the base plate and substrate is minimized for reduced package weight and the substrates are not stressed during connector plug connection.

4. A package according to claim 1 wherein the electrically insulating substrate is segmented with each segment being loosely secured to the base plate by the mechanical fasteners for reducing substantially the high stress levels induced in the base plate during temperature cycling, and having an electrical pattern including terminal pads adjacent a side thereof and flexible electrical connectors connected to selected terminal pads of adjacent segments for electrically interconnecting the electrical patterns of adjacent segments.

5. A package according to claim 4 wherein a segment of the segmented substrate contains an electrical lead pattern having a plurality of terminal pads defining a site for a multielement electro-optical device, said plurality of terminal pads selectively arranged on said substrate segment for connection to elements of the multielement electro-optical device.

* * * * *